United States Patent
Yu et al.

[19]

[11] Patent Number: 5,987,638
[45] Date of Patent: Nov. 16, 1999

[54] APPARATUS AND METHOD FOR COMPUTING THE RESULT OF A VITERBI EQUATION IN A SINGLE CYCLE

[75] Inventors: Robert K. Yu, Newark; Satish Padmanabhan, Sunnyvale, both of Calif.

[73] Assignee: LSI Logic Corporation, Milpitas, Calif.

[21] Appl. No.: 08/841,415

[22] Filed: Apr. 22, 1997

[51] Int. Cl.[6] ...................................................... G06F 11/10
[52] U.S. Cl. ............................................................ 714/795
[58] Field of Search .......................... 714/795, 791–792, 714/43.4; 375/341, 262; 704/242

[56] References Cited

U.S. PATENT DOCUMENTS

| | | | |
|---|---|---|---|
| 4,614,933 | 9/1986 | Yamashita et al. | 340/51 |
| 5,027,374 | 6/1991 | Rossman | 375/341 |
| 5,220,570 | 6/1993 | Lou et al. | 371/43.4 |
| 5,491,705 | 2/1996 | Pradhan et al. | 714/795 |
| 5,502,736 | 3/1996 | Todoroki | 371/43.7 |
| 5,504,784 | 4/1996 | Niyogi et al. | 375/341 |
| 5,509,020 | 4/1996 | Iwakiri et al. | 714/704 |
| 5,539,757 | 7/1996 | Cox et al. | 714/795 |
| 5,781,569 | 7/1998 | Fossorier et al. | 371/43.7 |
| 5,815,515 | 9/1998 | Daibiri | 371/43.7 |

FOREIGN PATENT DOCUMENTS 07273670  10/1995  Japan.

OTHER PUBLICATIONS

Masato Nagamatsu, et al. "A 15 NS 32X32–BIT CMOS Multiplier with an Improved Parallel Structure", Proceedings of the IEEE 1989 Custom Integrated Circuits Conference, May. 1989, pp. 10.3.1–10.3.4.

*Primary Examiner*—Albert De Cady
*Assistant Examiner*—Shelly A Chase
*Attorney, Agent, or Firm*—Skjerven, Morrill, MacPherson, Franklin & Friel LLP; Omkar Suryadevara

[57] ABSTRACT

A Viterbi calculator performs additions in parallel with comparison to compute the result of a single Viterbi equation in a single clock cycle. Therefore, the results of a butterfly operation involving two Viterbi equations can be computed in a single clock cycle by use of two Viterbi calculators. Alternatively, the butterfly operation can be implemented by a single Viterbi calculator used in a pipelined manner, although the throughput is at the rate of every two clock cycles. When a single Viterbi calculator is used in the pipelined manner, two multiplexers are used to alternately swap the constant values being supplied to the Viterbi calculator. The pipelined use of a single Viterbi calculator requires less space on an integrated circuit die than the parallel use of two Viterbi calculators, and is useful in applications where the variable data is available every two clock cycles (e.g. due to latency in accessing memory).

18 Claims, 4 Drawing Sheets

APPARATUS AND METHOD FOR COMPUTING THE RESULT OF A VITERBI EQUATION IN A SINGLE CYCLE

FIELD OF INVENTION

The present invention relates to an apparatus and method for performing a Viterbi computation used in, for example, digital signal processing.

BACKGROUND

A Viterbi computation is performed, for example, to decode an incoming sequence of symbols in reference to a predetermined set of symbols. See, for example, U.S. Pat. Nos. 5,502,736, 5,509,020, 5,504,784, 5,539,757 and 5,491,705.

In the Viterbi computation, the following two equations are used to compute new variable values $pk\{n+1\}$ and $pl\{n+1\}$ from previous variable values $pi\{n\}$ and $pj\{n\}$ using constants ri and rj, as follows:

$$pk\{n+1\}=\min(pi\{n\}+ri,\ pj\{n\}+rj) \quad \text{EQ1}$$

$$pl\{n+1\}=\min(pi\{n\}+rj,\ pj\{n\}+ri) \quad \text{EQ2}$$

Equations EQ1 and EQ2 can be represented in a diagram (FIG. 1) known as the "butterfly diagram". As seen from the above formulae, each of equations EQ1 and EQ2 requires the following steps: two additions, one comparison and one selection. Moreover, the variable values $pi\{n\}$ and $pj\{n\}$, and constant values ri and rj need to be loaded from memory, and the two results $pk\{n+1\}$ and $pl\{n+1\}$ need to be stored back into memory. Therefore, a total of 14 steps (eight steps for equations EQ1-EQ2, and six steps for accessing memory) are needed to implement the butterfly diagram of FIG. 1. Current digital signal processors (DSPs) implement the butterfly diagram (FIG. 1) in four or more clock cycles.

SUMMARY

In accordance with the invention, a calculator (hereinafter "Viterbi calculator") performs two additions to generate two signals (also called "sum signals"), and simultaneously generates another signal (also called "selection signal") for selecting one of the two sum signals. The sum signal selected by the Viterbi calculator is the result of a Viterbi equation (e.g. equation EQ1 described above), and is computed in a single clock cycle in this invention.

In one embodiment, the data signals for two Viterbi equations required by a Viterbi computation (i.e. equations EQ1-EQ2 described above) are made available (e.g. retrieved from memory) every clock cycle, and the two Viterbi equations are implemented simultaneously by two Viterbi calculators. That is, the two Viterbi calculators operate in parallel in a single clock cycle, and therefore this embodiment is several times faster than prior art devices, although more hardware is required than if a single Viterbi calculator is used (as described below).

In another embodiment, the three steps: (1) retrieval of data signals needed for a next Viterbi computation, (2) storage of data signals generated by a previous Viterbi computation and (3) implementation of a current Viterbi computation by a single Viterbi calculator are all performed simultaneously. In such an embodiment (also called "pipelined embodiment"), results of a Viterbi computation are generated every two clock cycles, as two Viterbi equations (e.g. equations EQ1 and EQ2 described above) are implemented alternately during each Viterbi computation. As retrieval of data signals and storage of data signals also take two clock cycles in this embodiment, all three steps are implemented in a synchronized and efficient manner.

In the pipelined embodiment, two multiplexers alternately swap two data signals of constant values (e.g. constants ri and rj) that are input to the Viterbi calculator. The Viterbi calculator computes the result of a first Viterbi equation (e.g. equation EQ1) when the two constant values are not swapped, and computes the result of a second Viterbi equation (e.g. equation EQ2) when the constant values are swapped. Therefore, the pipelined embodiment reuses a Viterbi calculator's hardware to alternately implement the two Viterbi equations, and therefore requires only two multiplexers in addition to the Viterbi calculator to implement the Viterbi computation. Hence, the pipelined embodiment is space efficient, i.e. takes less space on an integrated circuit die than, e.g. the above-described embodiment using two Viterbi calculators.

A Viterbi calculator is implemented, in one embodiment, by three parts: (1) a sums generator that performs additions to generate the two sum signals, (2) a parallel selector that performs comparisons to generate the selection signal, and (3) a multiplexer that selects, based on the selection signal, one of two sum signals. Specifically, the parallel selector generates the selection signal in parallel with the sum signals being generated by the sums generator, and the multiplexer uses the selection signal to select the minimum of the two sum signals. Generation of a selection signal in parallel with the sum signals is a critical aspect in this embodiment, and allows the results of a Viterbi equation to be generated in a single cycle.

In the just-described embodiment, the sums generator has four input buses and two groups of terminals. Two input buses (also called "constant buses") carry data signals for constant values ri and rj, and two other input buses (also called "variable buses") carry data signals for variable values $pi\{n\}$ and $pj\{n\}$. A first group of terminals carry a first sum signal, e.g. a signal of value $pi[n]+ri$, and a second group of terminals carry a second sum signal, e.g. a signal of value $pj\{n\}+rj$.

The parallel selector has four input buses that are directly connected to the four input buses of the sums generator, thereby to allow the parallel selector to operate in parallel with the sums generator. The parallel selector also has an output terminal that carries the selection signal. In this particular embodiment, the parallel selector computes the value $pi\{n\}+ri-pj\{n\}-rj$, and passes a carry signal generated in the computation to the parallel selector's output terminal (as the selection signal). The multiplexer has a control line connected to the parallel selector's output terminal, and responds to the selection signal by selectively coupling either the first group of terminals or the second group of terminals of the sums generator to the Viterbi calculator's output terminals (as described above).

In one variant of the above-described embodiment, the parallel selector is implemented by a number of 4:2 adders that are connected to a carry chain. The 4:2 adders perform subtraction using 2's complement arithmetic, by inverting the values to be subtracted and adding 1 to the inverted values at bit position 1. The carry chain receives carries and saves from the 4:2 adders and generates a carry signal. The carry signal is passed to the multiplexer as the selection signal (described above). Use of 4:2 adders and a carry chain eliminates the need for two full adders, and therefore saves space on the integrated circuit die, and is faster as compared to the use of two full adders.

DETAILED DESCRIPTION

Figure 1:
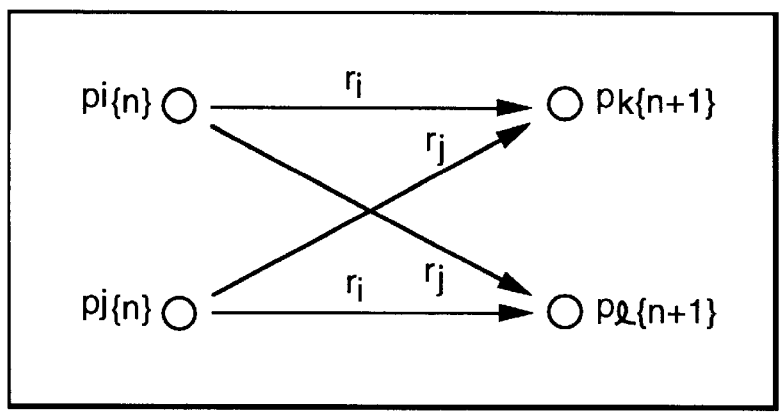
FIG. 1 illustrates, in a butterfly diagram, a Viterbi computation performed by digital signal processors of the prior art.

A calculator (also called "Viterbi calculator") 100 (FIG. 2) of this invention performs addition in parallel with comparison, so that the result of a Viterbi equation (e.g. equation EQ1 described above) is computed in a single clock cycle, as described below.

In one embodiment, Viterbi calculator 100 has four input buses 101–104 and an output bus 105. Each of input buses 101–104 and output bus 105 has N lines, where N is the operand size, e.g. 16. Two input buses (also called "variable buses") 101 and 103 carry signals indicative of previous values $pi\{n\}$ and $pj\{n\}$ of two variables, while the two input buses (also called "constant buses") 102 and 104 carry data signals of constant values ri and rj. Output bus 105 carries a signal of a new value $pk\{n+1\}$ computed according to the above-described equation EQ1. The same Viterbi calculator 100 can be used to calculate another new value $pl\{n+1\}$ by swapping the signals on constant buses 102 and 104 as described below in reference to FIG. 5.

Viterbi calculator 100 includes: (1) a sums generator 110 that computes two sum signals for values $pi\{n\}+ri$ and $pj\{n\}+rj$, (2) a multiplexer 120 that receives the two sum signals from sums generator 110, and (3) a parallel selector 130 that generates a signal (also called selection signal) for controlling the selection of one of the two sum signals by multiplexer 120. Parallel selector 130 generates the selection signal in the same clock cycle as the two sum signals being generated by sums generator 110, and thereby allows Viterbi calculator 100 to select one of the sum signals as the signal with new value pk[n+1] in a single cycle.

Specifically, sums generator 110 (FIG. 2) has four input buses: two input buses 112 and 114 that are connected to constant buses 102 and 104 and therefore carry data signals of constant values ri and rj, and two input buses 111 and 113 that are connected to variable buses 101 and 103 and therefore carry data signals of variable values $pi\{n\}$ and $pj\{n\}$. Sums generator 110 generates the two sum signals at two groups of terminals 115 and 116 that are coupled to multiplexer 120.

Parallel selector 130 also has four input buses 131–134 that are directly connected to the above-described four input buses 111–114 respectively of sums generator 110. Therefore, parallel selector 130 receives the same input signals as sums generator 110, and at the same time as sums generator 110, thereby to allow parallel selector 130 to operate in parallel with sums generator 110.

Parallel selector 130 generates, on an output terminal 135, the selection signal used to control multiplexer 120. The selection signal when active (e.g. low) indicates a second sum signal (of value $pj\{n\}+rj$) is to be selected by multiplexer 120, and when inactive (e.g. high) indicates a first sum signal (of value $pi\{n\}+ri$) is to be selected.

In one example, parallel selector 130 computes the value $pi\{n\}+ri-pj\{n\}-rj$ from the signals on input buses 131–134 and passes to multiplexer 120 (for use as the selection signal) a carry signal generated during the computation. When the carry signal has a value 0, the carry signal indicates that the value $pj\{n\}+rj$ is smaller than the value $pi\{n\}+ri$ (and vice versa when the carry signal has a value 1). Parallel selector 130 generates the carry signal a little later than the first and second sum signals generated by sums generator 110, but before the end of a single clock cycle.

Multiplexer 120 has an input line 124 that is connected to parallel selector 130's output terminal 135, and N output terminals 123 that are coupled to the N lines in output bus 105 of Viterbi calculator 100. Multiplexer 120 responds to the selection signal by selectively passing to output terminals 123 the indicated sum signal. Specifically, if the selection signal on line 124 is inactive, multiplexer 120 couples output terminals 123 to the first group of terminals 115, thereby to pass a signal of value $pi\{n\}+ri$ to output bus 105. Alternatively, if the selection signal on line 124 is active, multiplexer 120 couples output terminals 123 to the second group of terminals 116, thereby to pass a signal of value $pj\{n\}+rj$ to output bus 105.

Figure 3:
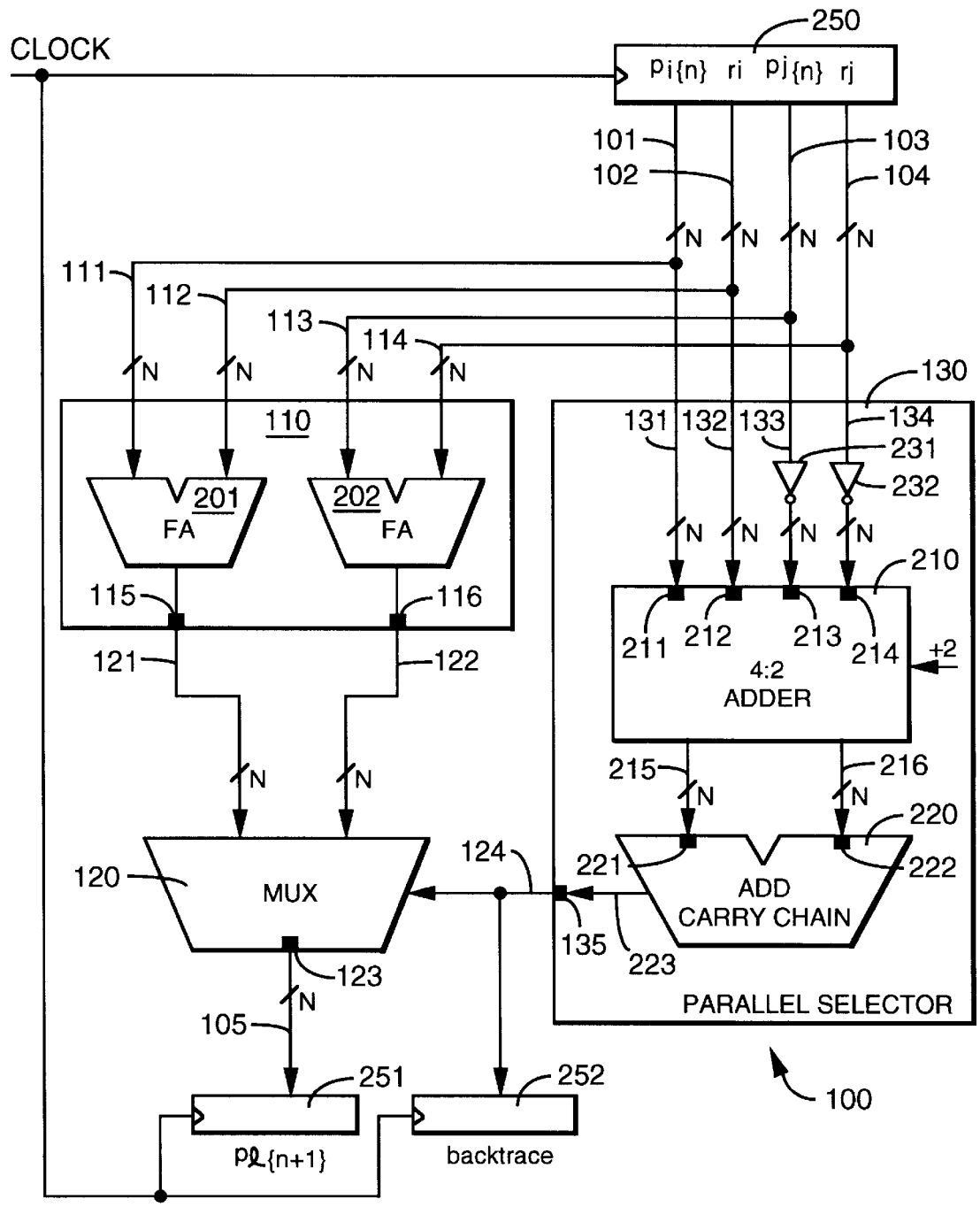
FIG. 3 illustrates, in an intermediate level block diagram, the calculator of FIG. 2.

Parallel selector 130 is implemented in one embodiment (FIG. 3) by a 4:2 adder (also called "4:2 compressor") 210 that is connected to a carry chain 220. 4:2 adder 210 performs subtraction using 2's complement arithmetic, by inverting the values $pj\{n\}$ and rj and adding 1, at bit position 1, to the two inverted values (illustrated by "+2" in FIG. 3). Specifically, 4:2 adder 210 has two groups of N input terminals 211 and 212 that are directly connected to two input buses 131 and 132. 4:2 adder 210 also has two additional groups of N input terminals 213 and 214 that are coupled through inverters 231 and 232 (included in parallel selector 130) to the other two input buses 133 and 134. 4:2 adder 210 has output buses 215 and 216 (each having N lines) that are respectively connected to input terminals 221 and 222 of carry chain 220. Carry chain 220 has an output line 223 that is connected to output terminal 135 of parallel selector 130.

Figure 4:
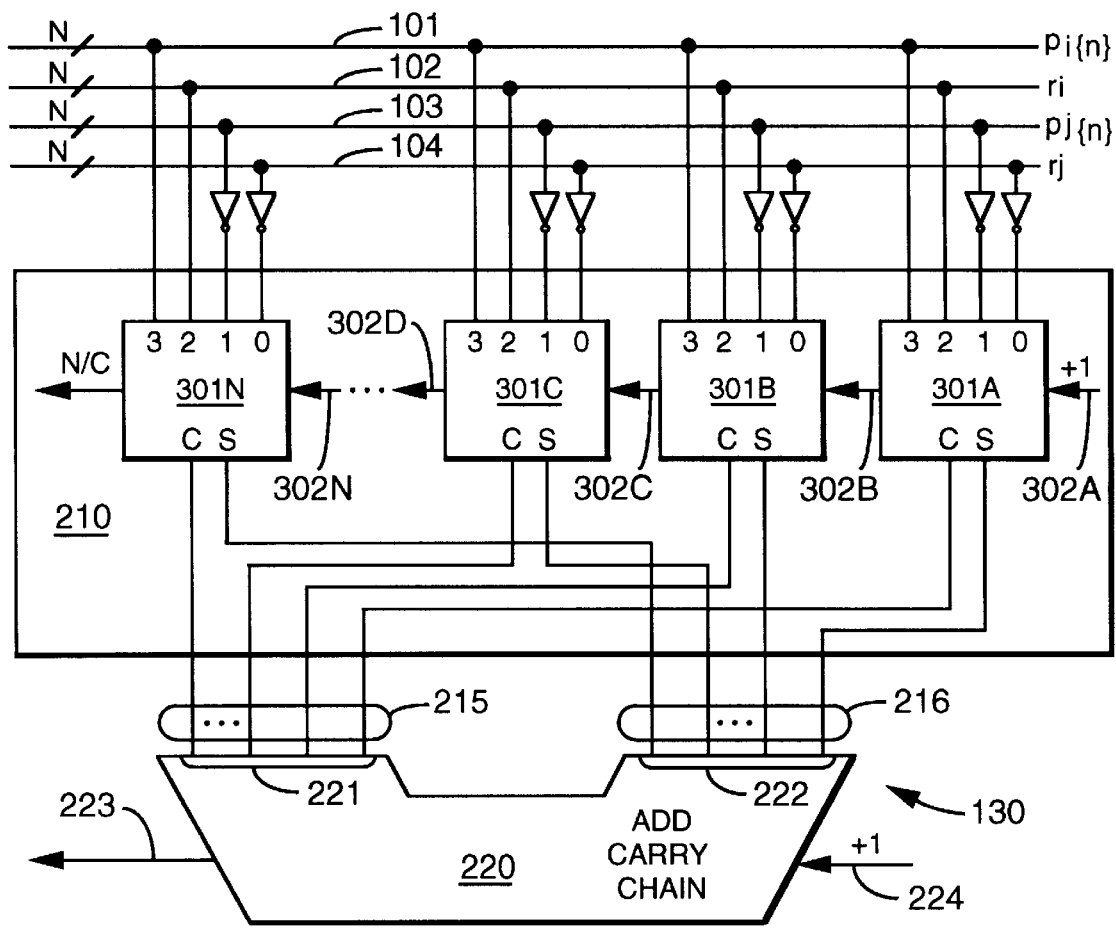
FIG. 4 illustrates, in a low level block diagram, the parallel selector of FIG. 3.

In one particular embodiment, the 4:2 adder 210 (FIG. 4) is implemented by a number (N+1) of single bit adders 301A–301N, where $A \leq I \leq N$. For example, for 16 bit operands, parallel selector 130 includes a total of seventeen single bit adders 301A–301N (for clarity not all seventeen single bit adders are illustrated in FIG. 4). N of the single bit adders e.g. adders 301A–301N each have four input terminals 0, 1, 2, and 3 (for convenience the same reference numerals are used for each adder 301I) that are coupled respectively to one of the N lines in each of the respective four buses 101–104 of Viterbi calculator 100. For example, terminals labeled "0" of single bit adders (also called "adders") 301A–301N are coupled through inverters (not labeled in FIG. 4) to the N individual lines of constant bus 104.

To implement the "+2" (in the subtraction described earlier), a "+1" value is injected at line 302A to the carry-in signal of single bit adder 301A and a second "+1" value is injected at line 224 to the carry-in signal of the add carry chain 220. Single bit adders 301A–301N are chained, with a carry signal from each previous adder 301I being passed as an input signal to the next adder 301I+1. For example, the carry signal from adder 301A is passed as an input signal to adder 301B on line 302A.

The carry signal from the remaining adder 301N is not used, as indicated by the symbol N/C (for "no connect") in FIG. 4. The sum signals generated by adders 301A–301N at output terminals S are passed by a bus 216 to carry chain 220, and the carry signals generated by adders 301A–301N at output terminals C are passed by another bus 215 to carry chain 220. Carry chain 220 adds values of signals at terminals 221 and 222, and generates a carry signal on output line 223.

In this embodiment, carry chain 220 is implemented as a ripple adder for bits, e.g. a 16 bit ripple adder for use with 16 bit operands. Therefore Viterbi calculator 100 of this embodiment uses space approximately equal to the space required by only three full adders: space of one full adder (to implement 4:2 adder 210 and add carry chain 220) in parallel selector 130 and space of two full adders (e.g. implemented as the well known carry look-ahead, carry select, or carry skip adders) in sums generator 110 (see FIG. 3). In addition, Viterbi calculator 100 uses only one row of inverters (all included in parallel selector 130), one multiplexer 120, and registers 250–252. Such small amount of hardware takes less space on an integrated circuit die than prior art circuits for Viterbi calculation, and is therefore preferred in this embodiment.

Figure 2:
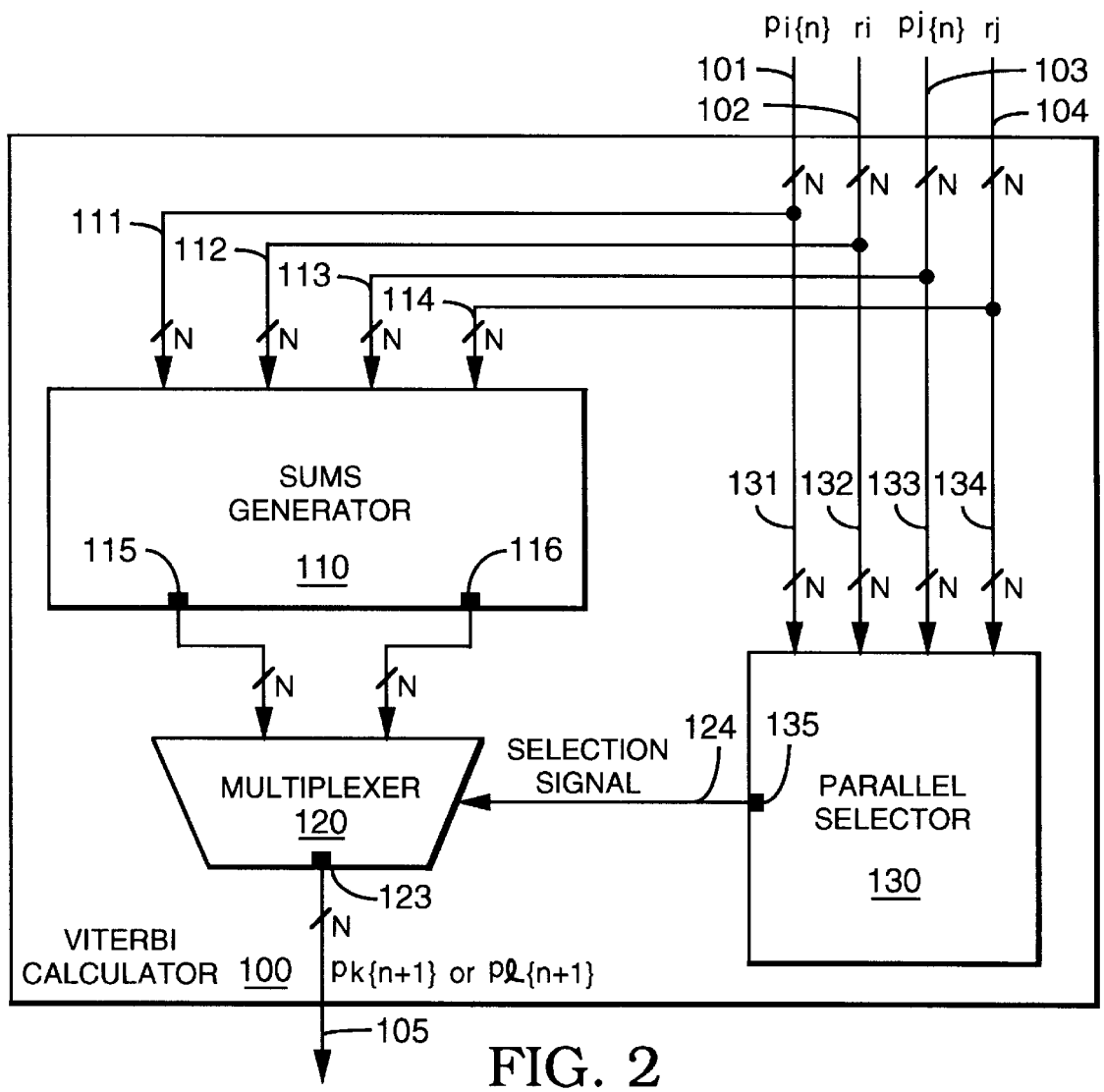
FIG. 2 illustrates, in a high-level block diagram, one embodiment of a calculator (also called "Viterbi calculator") for computing the result of a Viterbi equation in a single cycle.

Adders 301A–301N can be implemented as illustrated in FIG. 2 of the article "A Fifteen NS 32×32-bit CMOS Multiplier With An Improved Parallel Structure" by Masato Nagamatsu, et al., Proceedings of the IEEE 1989 CUSTOM INTEGRATED CIRCUITS CONFERENCE, San Diego, Calif., May 15–18, 1989, pages 10.3.1–10.3.4, incorporated by reference herein in its entirety. However, 4:2 adder 210, as well as various other parts described herein (such as carry chain 220) can be implemented in any manner known to a person skilled in the art of designing processors, in view of the disclosure. Moreover, although one embodiment of parallel selector 130 is illustrated in FIGS. 3 and 4, other parallel selectors can also be used, as long as a selection signal is generated in the same clock cycle as the two sum signals.

In the embodiment illustrated in FIG. 3, input buses 101–104 are coupled to a storage element 250 (e.g. a register) that holds the values pi{n}, ri, pj{n} and rj. The results from output bus 105 are stored in another storage element 251. Finally, the carry signal on line 124 is also stored in yet another storage element 252. The values in storage element 250 are retrieved from, for example, memory or from a previous computation, e.g. from storage element 251. Similarly, the results in storage element 251 are saved into, for example, a memory. Each of storage elements 250–252 is clocked by the same signal CLOCK. In one embodiment signal CLOCK is designed to have a frequency low enough to permit a result signal to be latched by storage element 251. The value of the carry signal (also called "backtrace bit") can be used, for example, to traverse a tree of such Viterbi computations in a manner well known in the art of digital signal processing.

The values to be used in a next cycle of signal CLOCK can be retrieved from memory and stored into storage element 250 in the current cycle of signal CLOCK (during which a Viterbi equation is implemented). Therefore storage element 250 can be loaded with new data for variables pi{n} and pj{n} every two clock cycles. Moreover, a value generated in a previous cycle of signal CLOCK can be stored into memory from storage element 251 in the current cycle of signal CLOCK. As at least two cycles in signal CLOCK are required to retrieve values of the two variables pi{n} and pj{n}, the same Viterbi calculator 100 can be used during these two cycles to implement the Viterbi computation in a pipelined manner.

Figure 5:
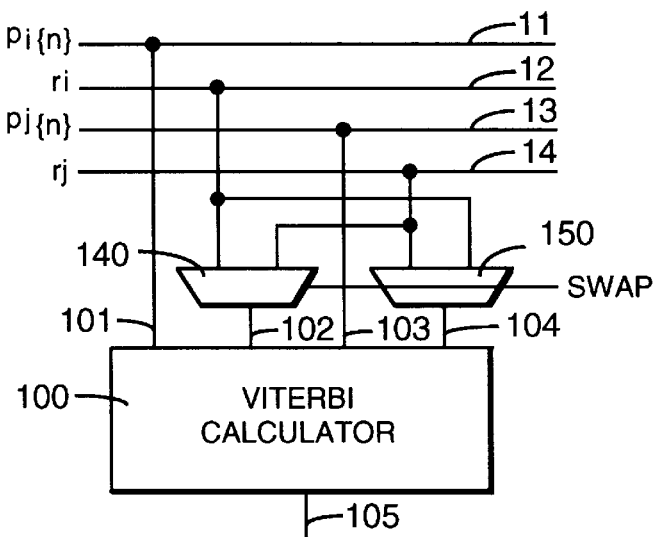
FIG. 5 illustrates use of two multiplexers with the Viterbi calculator of FIG. 2 to implement the Viterbi computation using the single calculator.
Figure 6:
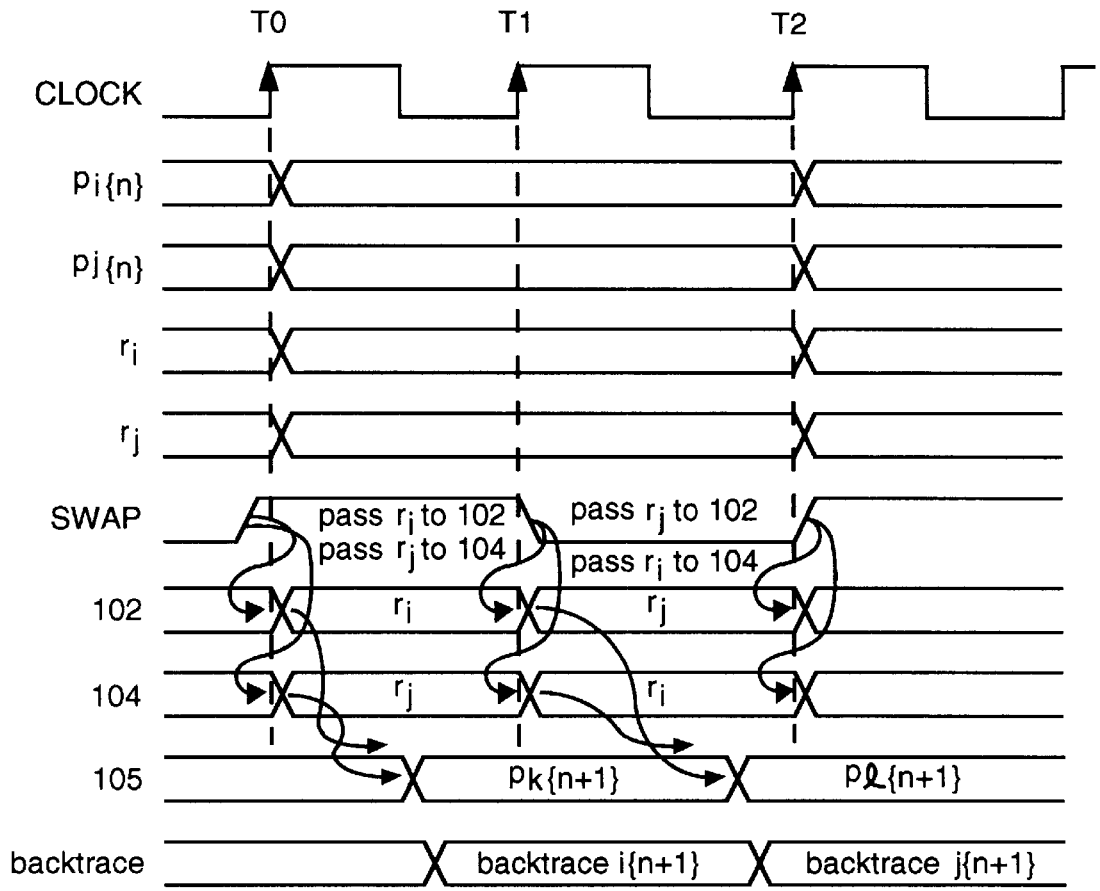
FIG. 6 illustrates, in a timing diagram, generation of the results of a Viterbi computation every two cycles by the embodiment of FIG. 5.

In a pipelined embodiment illustrated in FIG. 5, Viterbi calculator 100 is coupled to two multiplexers 140 and 150 (FIG. 5) that alternately swap signals supplied to first constant bus 102 and second constant bus 104. Hence, in a first cycle of signal CLOCK, e.g. between times T0 and T1 (FIG. 6) an input signal SWAP that is supplied to multiplexers 140 and 150 (FIG. 5) is inactive (e.g. high), thereby causing multiplexers 140 and 150 to pass constant signals (of values ri and rj) from buses 12 and 14 (FIG. 5) to respective first and second constant buses 102 and 104. After a certain delay period (e.g. half clock cycle) starting at time T0, Viterbi calculator 100 produces, on output bus 105, a signal for the new value pk{n+1}. The signal for new value pk{n+1} remains valid after the first clock cycle (e.g. after time T1) until a signal for the next new value is generated on output bus 105, as described next.

At the beginning of a second clock cycle, e.g. at time T1 (FIG. 6), signal SWAP goes active (e.g. low), thereby causing multiplexers 140 and 150 (FIG. 5) to couple first constant bus 102 and second constant bus 104 to the respective buses 14 and 12 that carry signals for values rj and ri. Signal SWAP can be generated, for example, by a decoder (not shown) from an instruction for the Viterbi computation. Therefore, after the delay period starting at time T1, Viterbi calculator 100 generates on output bus 105 a signal for the second new value pl{n+1}.

After the second clock cycle, e.g. after time T2, single Viterbi calculator 100 uses variables of new values pi{n+1}, pj{n+1} (and optionally constants of new values ri and rj) for the next Viterbi calculations. The new values pi{n+1}, pj{n+1} (an ri and rj if necessary) are retrieved in the first and second clock cycles (i.e. between times T0 and T2).

Therefore, the pipelined embodiment (FIG. 5) is useful in various applications where the variable data pi{n} and pj{n} is available only every two clock cycles (a current clock cycle in which, for example, due to latency in accessing memory, or if only a single operand can be accessed from memory in each clock cycle. Moreover, the pipelined use of a single Viterbi calculator 100 (FIG. 5) requires less space on an integrated circuit die than the parallel use of two such Viterbi calculators as illustrated in FIG. 7 (described below).

In another embodiment, two Viterbi calculators 100A and 100B (FIG. 7) that are identical to the above-described Viterbi calculator 100 are coupled to buses 11-14 to generate the two new values pk{n+1} and pl{n+1} in a single clock cycle. Specifically, a first variable bus 101A, a first constant bus 102A, a second variable bus 103A and a second constant bus 104A of Viterbi calculator 101A are directly coupled to buses 11, 12, 13 and 14 respectively. Moreover, a first variable bus 101B, a first constant bus 102B, a second variable bus 103B and a second constant bus 104B of Viterbi calculator 100B are coupled to buses 11, 14, 13 and 12 respectively.

Figure 7:
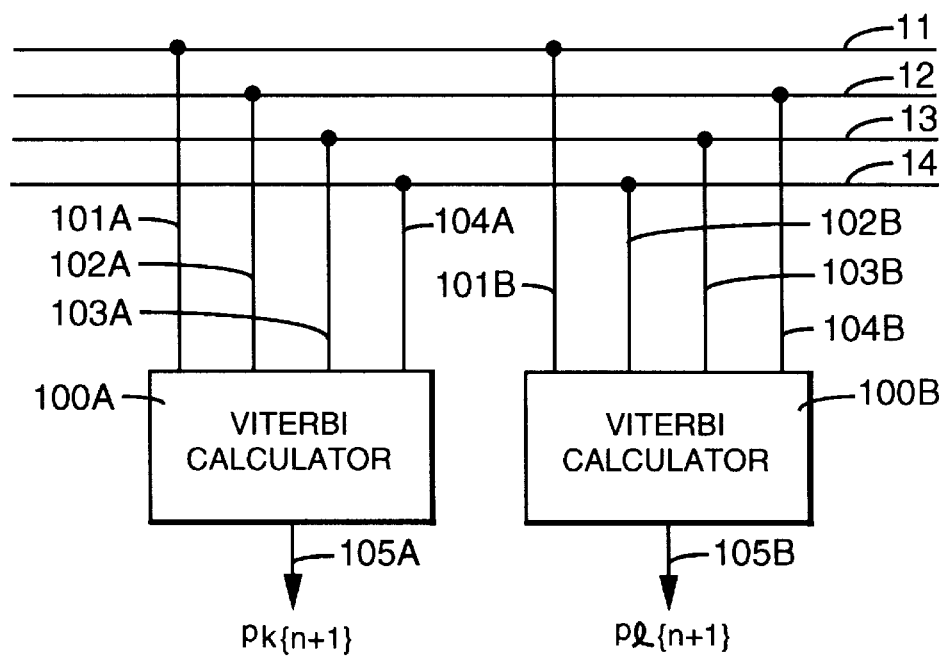
FIG. 7 illustrates, in a high-level block diagram, the parallel use of two of the calculators of FIG. 2 to perform an entire Viterbi computation in a single cycle.

As noted above, the parallel embodiment illustrated in FIG. 7 requires more gates than the number of gates used in the pipelined embodiment illustrated in FIG. 5. Moreover, the parallel embodiment requires that both variable values pi{n} and pj{n} are available in every clock cycle, e.g. by use of an on-chip cache memory having a latency of less than one clock cycle.

Numerous modifications and adaptations of the above-described embodiments will be obvious to a person skilled in the art of designing processors (such as digital signal processors and microprocessors) in view of the enclosed disclosure. For example, instead of using full adders in the sums generator, half adders can be used. Moreover, instead of using a 4:2 adder, or a carry chain, a full adder can be used, although such use of one or more full adders requires more space, and is slower than the above-described use of a 4:2 adder and a carry chain.

Therefore, various modifications and adaptations of this invention are encompassed by the accompanying claims.

We claim:

1. An apparatus for performing a Viterbi computation, said apparatus comprising a first device, said first device having: a first variable bus, a second variable bus, a first constant bus, and a second constant bus for carrying signals of values pi {n}, pj {n}, ri and rj, said first device comprising:
    a sums generator having four input buses and two groups of terminals, each input bus being directly connected to one of said first variable bus, said second variable bus, said first constant bus and said second constant bus, wherein said sums generator generates a first sum signal of value pi{n}+ri at a first group of terminals, and a second sum signal of value pi{n}+rj at a second group of terminals;
    a parallel selector having four input buses and an output terminal, said four input buses of said parallel selector being directly connected to said four input buses of said sums generator; and
    a multiplexer having two input buses, a control line and a group of output terminals, said two input buses of said multiplexer being connected to said two groups of terminals of said sums generator, said control line being connected to said output terminal of said parallel selector; wherein:
        said multiplexer responds to a signal on said control line by selectively coupling one of said two input buses of said multiplexer to said group of output terminals of said multiplexer.

2. The apparatus of claim 1 wherein said sums generator includes two full adders, a first full adder being coupled to receive signals from said first variable bus and said first constant bus thereby to supply a signal of value pi{n}+ri at said first group of terminals, and said second full adder being coupled to receive signals from said second variable bus and said second constant bus thereby to supply a signal of value pj {n}+rj at said second group of terminals.

3. The apparatus of claim 1 wherein said parallel selector includes:
    a plurality of 4:2 adders coupled to said four input buses of said parallel selector; and
    a carry chain having an output line and a plurality of input terminals, said output line being coupled to said output terminal of said parallel selector and said input terminals being coupled to said row of 4:2 adders.

4. The apparatus of claim 3 wherein said parallel selector further comprises a plurality of inverters, at least a group of said 4:2 adders being coupled through said inverters to two of said four input buses of said parallel selector.

5. The apparatus of claim 1 further comprising a second device identical to said first device, wherein said first variable buses of each of said devices are coupled together, said second variable buses of each of said devices are coupled together, said first constant bus of said first device is coupled to said second constant bus of said second device and said second constant bus of said first device is coupled to said first constant bus of said second device.

6. The apparatus of claim 1 further comprising two multiplexers, a first multiplexer having a first group of output terminals coupled to said first constant bus and said second multiplexer having a second group of output terminals coupled to said second constant bus.

7. A method for performing a Viterbi computation using signals of values pi{n}, pj{n}, ri and rj, said method comprising:
    generating a first sum signal of value pi{n}+ri, and a second sum signal of value pj{n}+rj using said signals of values pi{n}, pj{n}, ri and rj;
    generating a selection signal using said signals of values pi{n}, pj{n}, ri and rj, said selection signal indicating the minimum of said first sum signal and said second sum signal; and
    selecting the minimum of said first sum signal and said second sum signal using the selection signal.

8. The method of claim 7 wherein said generating of selection signal comprises:
    computing the value pi{n}+ri−pj{n}−rj; and
    passing a carry signal generated during said computing as the selection signal.

9. The method of claim 7 wherein each of said generatings, and said selecting are included in a current cycle, said method further comprising:
    storing an output signal from a previous cycle during said current cycle.

10. A method for performing a Viterbi computation using signals of values pi{n}, pj{n}, ri and rj, said method comprising:
    generating a first sum signal of value pi{n}+ri, and a second sum signal of value pj{n}+rj using said signals of values pi{n}, pj{n}, ri and rj;
    simultaneously generating a selection signal using said signals of values pi{n}, pj{n}, ri and rj, said selection signal indicating the minimum of said first sum signal and said second sum signal; and
    selecting the minimum of said first sum signal and said second sum signal using the selection signal;
    wherein said generating, said simultaneous generating and said selecting are included in a current cycle, said method further comprising storing an output signal from a previous cycle during said current cycle; and
    wherein said signals of values ri and rj are supplied to two buses of a single device implementing said cycle, said method further comprising alternately swapping between supplying signals of values ri and rj or signals of values rj and ri to said two buses.

11. A method for performing a Viterbi computation using signals of values pi{n}, pj{n}, ri and rj, said method comprising:
    generating a first sum signal of value pi{n}+ri, and a second sum signal of value pj{n}+rj using said signals of values pi{n}, pj{n}, ri and rj;
    simultaneously generating a selection signal using said signals of values pi{n}, pj{n}, ri and rj, said selection signal indicating the minimum of said first sum signal and said second sum signal;
    selecting the minimum of said first sum signal and said second sum signal using the selection signal; and retrieving the signals of values pi{n+1} and pj{n+1} during said current cycle and a next cycle following said current cycle.

12. The method of claim 11 further comprising:

retrieving the signals of values ri and rj during said current cycle and said next cycle.

13. A method for performing a Viterbi computation using signals of values pi{n}, pj{n}, ri and rj, said method comprising:

generating a first sum signal of value pi{n}+ri, and a second sum signal of value pj{n}+rj using said signals of values pi{n}, pj{n}, ri and rj;

simultaneously generating a selection signal using said signals of values pi{n}, pj{n}, ri and rj, said selection signal indicating the minimum of said first sum signal and said second sum signal;

selecting the minimum of said first sum signal and said second sum signal using the selection signal; and generating a third sum signal of value pi{n}+rj, and a fourth sum signal of value pj{n}+ri using said signals of values pi{n}, pj{n}, ri and rj.

14. The method of claim 13, wherein:

said sum signals are generated simultaneously.

15. The method of claim 13, wherein:

said third sum signal and said fourth sum signal are generated in a next cycle following a current cycle, said first sum signal and said second sum signal are generated in said current cycle.

16. The method of claim 10 further comprising:

generating a third sum signal of value pi{n}+rj, and a fourth sum signal of value pj{n}+ri using said signals of values pi{n}, pj{n}, ri and rj.

17. The method of claim 11 further comprising:

generating a third sum signal of value pi{n}+rj, and a fourth sum signal of value pj{n}+ri using said signals of values pi{n}, pj{n}, ri and rj.

18. The method of claim 7 wherein:

each of said sum signals are generated simultaneous with each other.

\* \* \* \* \*